(12) United States Patent
Jen et al.

(10) Patent No.: US 10,998,320 B2
(45) Date of Patent: May 4, 2021

(54) MEMORY STRUCTURE AND METHOD OF MANUFACTURING THE SAME

(71) Applicant: Winbond Electronics Corp., Taichung (TW)

(72) Inventors: Kai Jen, Taichung (TW); Shou-Te Wang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/575,734

(22) Filed: Sep. 19, 2019

(65) Prior Publication Data
US 2020/0312856 A1 Oct. 1, 2020

(30) Foreign Application Priority Data
Mar. 29, 2019 (TW) .................................. 108111114

(51) Int. Cl.
*H01L 27/00* (2006.01)
*H01L 27/108* (2006.01)

(52) U.S. Cl.
CPC .. *H01L 27/10823* (2013.01); *H01L 27/10876* (2013.01); *H01L 27/10891* (2013.01)

(58) Field of Classification Search
CPC ......... H01L 27/10823; H01L 27/10891; H01L 27/10876; H01L 29/7827; H01L 29/66666; H01L 29/4236; H01L 29/66825; H01L 29/4966
See application file for complete search history.

(56) References Cited

U.S. PATENT DOCUMENTS 8,921,899 B2 12/2014 Juengling et al.
9,178,039 B2 * 11/2015 Park .................. H01L 29/66621
2015/0349073 A1 12/2015 Kang

* cited by examiner

*Primary Examiner* — Nikolay K Yushin
(74) *Attorney, Agent, or Firm* — Muncy, Geissler, Olds & Lowe, P.C.

(57) ABSTRACT

The memory structure includes a substrate, an isolation structure disposed in the substrate; a word line trench; and a word line disposed in the word line trench. The word line has an upper gate and a lower gate. The upper gate includes an upper gate dielectric layer; an upper gate liner disposed on the upper gate dielectric layer; and an upper gate electrode disposed on the upper gate liner. The lower gate includes a lower gate dielectric layer; a lower gate liner disposed on the lower gate dielectric layer; and a lower gate electrode disposed on the lower gate liner. The vertical distance between the top surface of the upper gate dielectric layer and the bottom surface of the word line trench is not greater than that between the top surface of the upper gate electrode and the bottom surface of the word line trench.

16 Claims, 9 Drawing Sheets

MEMORY STRUCTURE AND METHOD OF MANUFACTURING THE SAME

CROSS REFERENCE TO RELATED APPLICATIONS

This Application claims priority of Taiwan Patent Application No. 108111114, filed on Mar. 29, 2019, the entirety of which is incorporated by reference herein.

BACKGROUND OF THE INVENTION

Field of the Invention

The present invention relates to memory devices, and in particular it relates to dynamic random access memory devices and methods of manufacturing the same.

Description of the Related Art

Dynamic Random Access Memory (DRAM) devices are widely used in consumer electronic products, such as personal computers, smartphones, and tablet computers. As electronic products are getting smaller, there is a need to miniaturize the memory devices used therein.

Although efforts have been made toward miniaturizing memory devices, there are still a lot of unmet needs, such as the gate induced drain leakage (GIDL) and the sub-leakage, etc. Therefore, there is a great need in the market for a novel memory device to solve these problems.

BRIEF SUMMARY OF THE INVENTION

Gate induced drain leakage occurs in regions where the gate and drain overlap. When a big negative bias voltage is applied to the gate, the channel is in an off state or an accumulation state and the overlapping region of the drain is subject to depletion. Also, a big positive bias voltage is applied to the drain. The larger the voltage difference between the gate and the drain, the larger the electrical field. The energy bands on both sides are pulled, which will generate electron-hole pairs of tunneling of valence band electrons into the conduction band in the drain region. The generated electrons and holes are collected by the drain and the substrate, respectively, causing leakage. Therefore, the more negative the drain voltage is or the more the drain voltage is increased, the larger the vertical electrical field is, and the bigger the gate induced drain leakage is.

In addition, sub-leakage is a small amount of leakage between the source and the drain when the gate voltage is lower than the threshold voltage required for the linear conduction of the transistor, namely, in the off state (or subcritical state). Therefore, in order to reduce the sub-leakage, a gate negative bias voltage needs to be applied. However, because the gate voltage is now more negative, the vertical electrical field is greater, and the gate induced drain leakage increases accordingly.

According to some embodiments of the present invention, the applied drain voltages can be controlled separately by forming two gates in a word line, thereby reducing the sub-leakage and the gate induced drain leakage at the same time.

The present invention provides a memory structure and a method of manufacturing the same. The memory structure includes a substrate, an isolation structure, a word line trench, and a word line. The isolation structure is disposed in the substrate. The word line trench is disposed in the substrate. The word line trench has a bottom surface. The word line is disposed in the word line trench. The word line has an upper gate and a lower gate. The upper gate includes an upper gate dielectric layer, an upper gate liner, and an upper gate electrode. The upper gate dielectric layer is disposed in the word line trench. The upper gate dielectric layer has a top surface. The upper gate liner is disposed on the upper gate dielectric layer. The upper gate electrode is disposed on the upper gate liner. The upper gate electrode has a top surface. The lower gate includes a lower gate dielectric layer, a lower gate liner, and a lower gate electrode. The lower gate dielectric layer is disposed in the word line trench. The lower gate liner is disposed on the lower gate dielectric layer. The lower gate electrode is disposed on the lower gate liner. The vertical distance between the top surface of the upper gate dielectric layer and the bottom surface of the word line trench is not greater than the vertical distance between the top surface of the upper gate electrode and the bottom surface of the word line trench.

BRIEF DESCRIPTION OF THE DRAWINGS

The present invention can be more fully understood by reading the subsequent detailed description and examples with references made to the accompanying drawings, wherein:

FIGS. 2A to 9A illustrate cross-sectional views of FIG. 1 at various manufacturing stages taken along line A-A'.

FIGS. 2B to 9B illustrate cross-sectional views of FIG. 1 at various manufacturing stages taken along line B-B'.

DETAILED DESCRIPTION OF THE INVENTION

Figure 1:
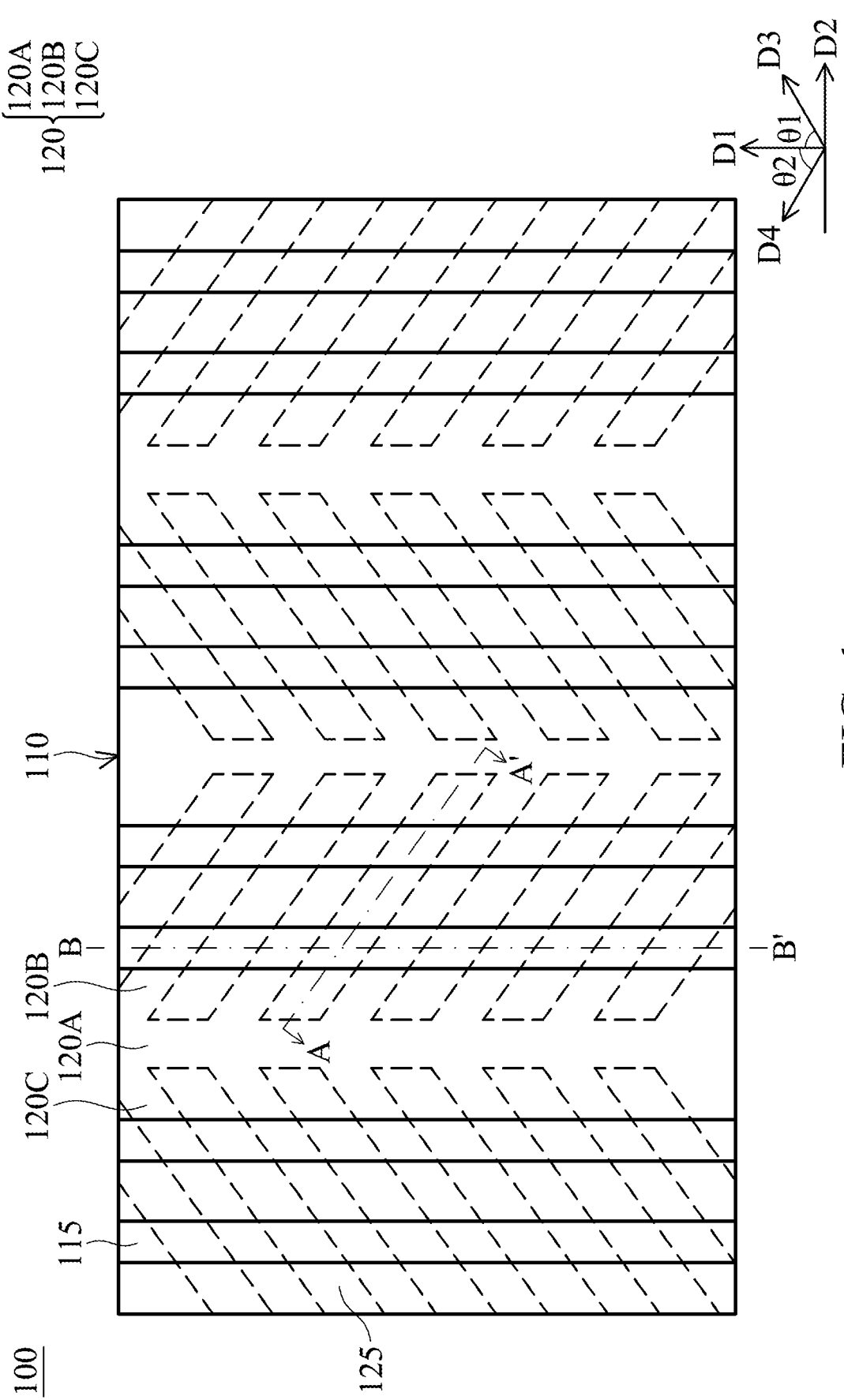
FIG. 1 is a top view illustrating the memory device structure in accordance with some embodiments of the present invention.

FIG. 1 illustrates a top view of a memory structure 100 in accordance with some embodiments of the present invention. The memory structure 100 includes a substrate 110, word lines 115, isolation structures 120 and active areas 125. For the sake of simplicity and clarity, FIG. 1 only shows the foregoing features, and the remaining features are shown in cross-sectional views of FIG. 9A or 9B, which are taken along line A-A' or line B-B' in FIG. 1, respectively.

Referring to FIG. 1, the isolation structures 120 is formed in the substrate 110 and the isolation structures 120 include isolation structures 120A, isolation structures 120B and isolation structures 120C. The isolation structures 120A extend along a direction D1 and are arranged in a direction D2. The isolation structures 120B extend along a direction D4 and the isolation structures 120C extend along a direction D3. The isolation structures 120B and the isolation structures 120C are each arranged in the direction D1, and the isolation structures 120B and the isolation structures 120C are alternately arranged in the direction D2. In some embodiments, the isolation structures 120 can be a shallow trench isolation structure.

The direction D1 is substantially perpendicular to the direction D2, the direction D1 intersects the direction D3 at a first angle θ1, and the direction D1 intersects the direction D4 at a second angle θ2. In some embodiments, the first angle θ1 is the same as the second angle θ2.

The active areas 125 in the substrate 110 are defined by the isolation structures 120. Specifically, one active area 125 is defined by two isolation structures 120A and two isolation structures 120B, and one active region 125 is defined by two isolation structures 120A and two isolation structures 120C.

Figure 9A:
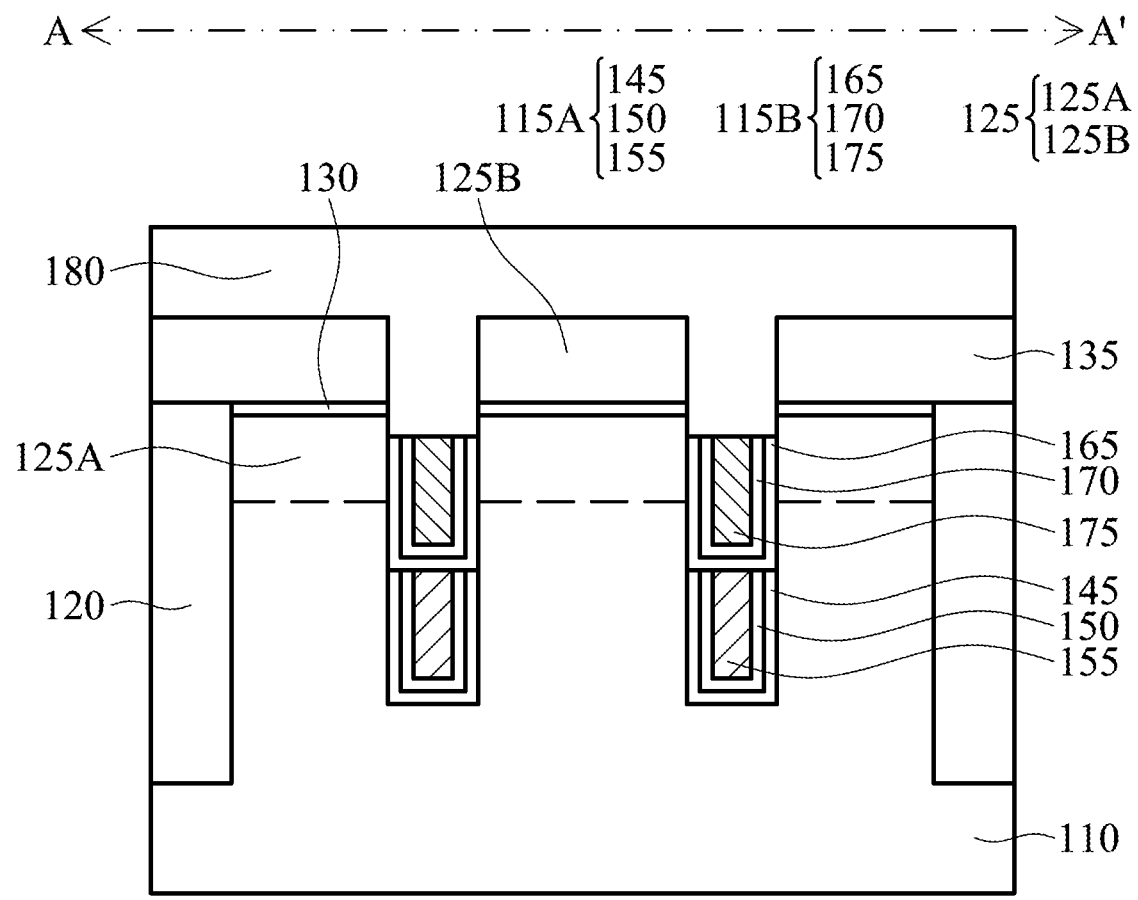

The word lines 115 are formed in the substrate 110 and extend along the direction D1. The word lines 115 are arranged in the direction D2 in such a way that one pair of word lines 115 corresponds to active areas 125. Referring to FIG. 9A, the active areas 125 include source/drain regions 125A and 125B. The source/drain regions 125A are substantially disposed between opposite inner sides of the pair of word lines 115. The source/drain regions 125B are substantially disposed between opposite outer sides of the pair of neighboring word lines 115 and the isolation structures 120A.

Still referring to FIG. 9A, the word line 115 include lower gate 115A and upper gate 115B, wherein the lower gate 115 includes a lower gate dielectric layer 145, a lower gate liner 150 and a lower gate electrode 155, and the upper gate 115 include an upper gate dielectric layers 165, an upper gate liners 170 and an upper gate electrodes 175. Since the word line 115 of the memory structure 100 of the present invention has the lower gate 115A and the upper gate 115B, the lower gate 115A and the upper gate 115B can separately control the applied gate voltages, and then reduce the phenomena of the sub-leakage and the gate induced drain leakage at the same time, thereby improving the reliability of the memory.

FIGS. 2A to 9A and FIGS. 2B to 9B illustrate cross-sectional views of the memory structure 100 at various manufacturing stages in accordance with embodiments of the present invention. FIGS. 2A to 9A illustrate cross-sectional views of FIG. 1 at various manufacturing stages taken along line A-A', and FIGS. 2B to 9B illustrate cross-sectional views of FIG. 1 at various manufacturing stages taken along line B-B'.

Figure 2A:
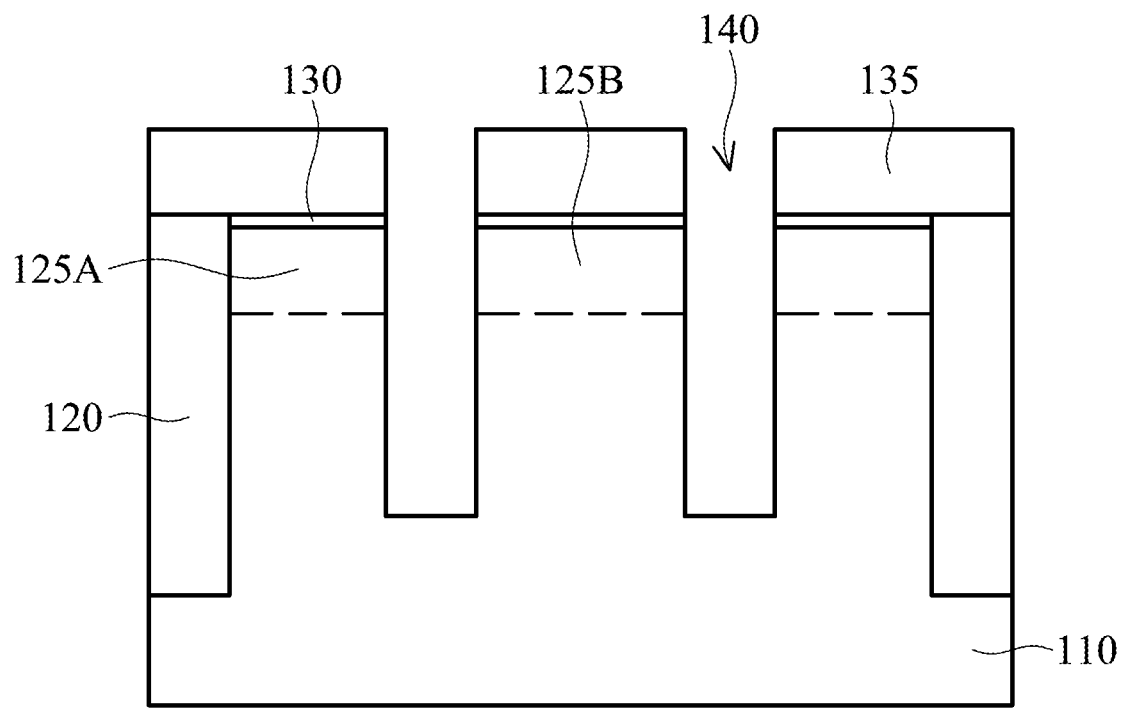

Referring to FIG. 2A, a substrate 110 is provided. In some embodiments, the substrate 110 may be an elemental semiconductor substrate; a semiconductor-on-insulator (SOI) substrate; or the like. In general, the semiconductor-on-insulator (SOI) substrate includes a layer of a semiconductor material formed on an insulation layer. The insulation layer may be, for example, a buried oxide (BOX) layer, a silicon oxide layer or the like. Next, an oxide layer 130 is formed on the substrate 110. The material of the oxide layer 130 may be $SiO_2$.

Next, a patterning process is performed. A photoresist material is formed on the top surface of the oxide layer 130, followed by optical exposure, post-exposure baking and development to remove a portion of the photoresist material to form a patterned photoresist layer. The patterned photoresist layer will be used as an etching mask for etching. A bi- or tri-layer of photoresist can be implemented. Then, the oxide layer 130 and a portion of the substrate 110 can be etched using any acceptable etching process to form trenches in the substrate 110. Next, the patterned photoresist layer is removed.

Next, an insulation material is filled into the trenches by a deposition process to form isolation structures 120 and define active areas 125 of the substrate 110.

Next, a hard mask layer 135 is formed on the substrate 110. Specifically, the hard mask layer 135 is formed on the oxide layer 130 and the isolation structures 120. The material of the hard mask layer 135 can be tetraethoxysilane (TEOS).

Figure 2B:
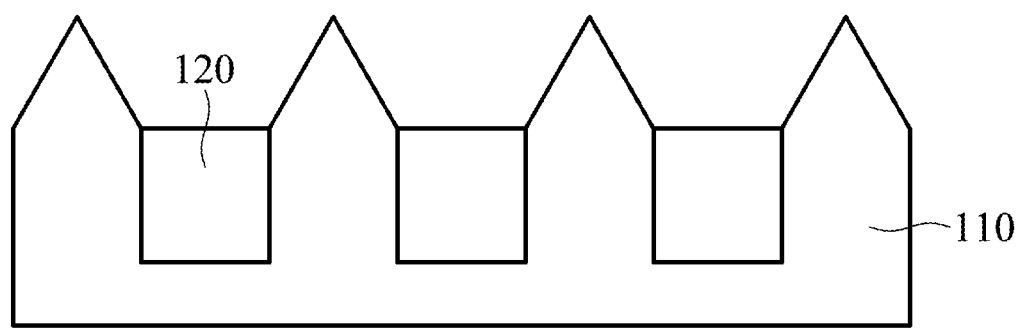

Next, the hard mask layer 135 and the oxide layer 130 are etched to form word line trenches 140 by a patterning process and an etching process. Specifically, the word line trenches 140 are formed between the isolation structures 120 as a pair of word line trenches 140 and are arranged in the direction D2 (as shown in FIG. 1). Referring to FIG. 2B, since the substrate 110 and the isolation structures 120 have different selectivities to etching, the isolation structures 120 will be etched deeper while the substrate 110 will be etched shallower and exhibit a triangular cross-sectional profile.

Figure 3A:
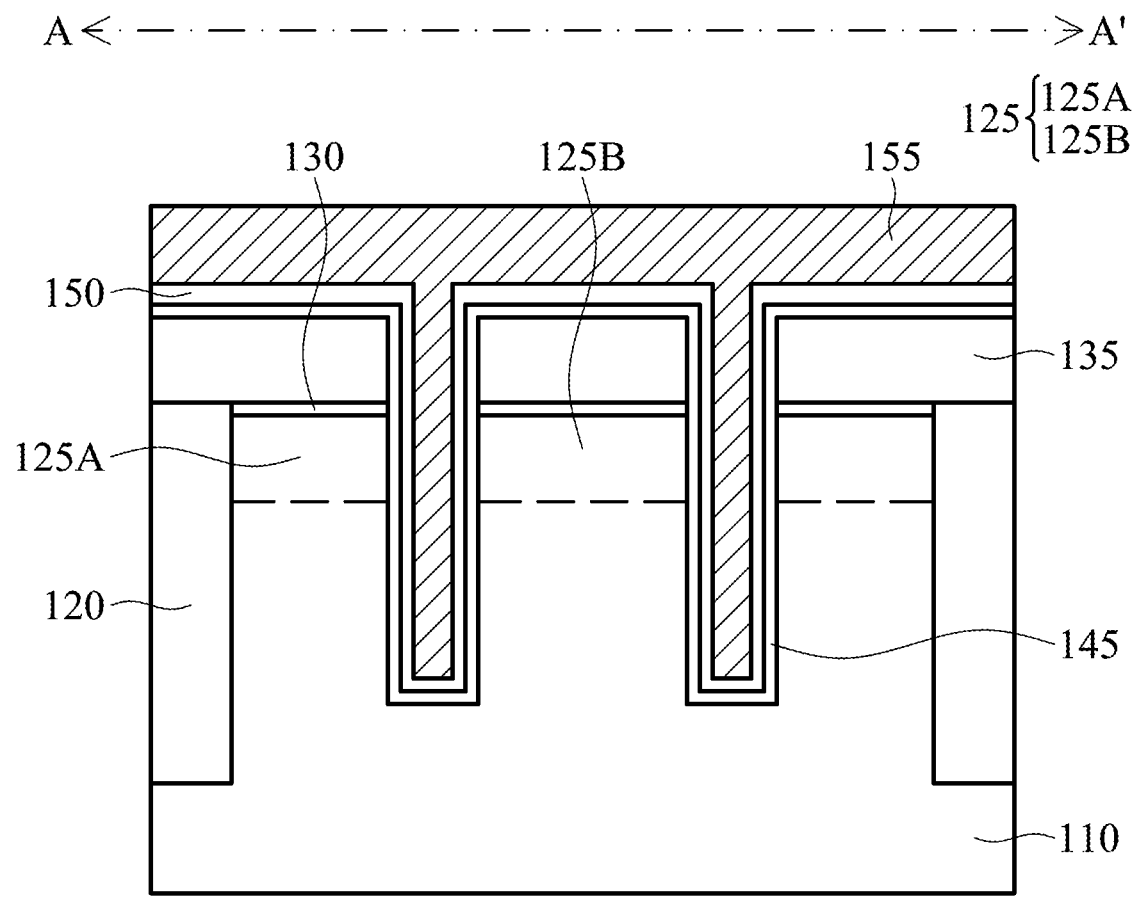
Figure 3B:
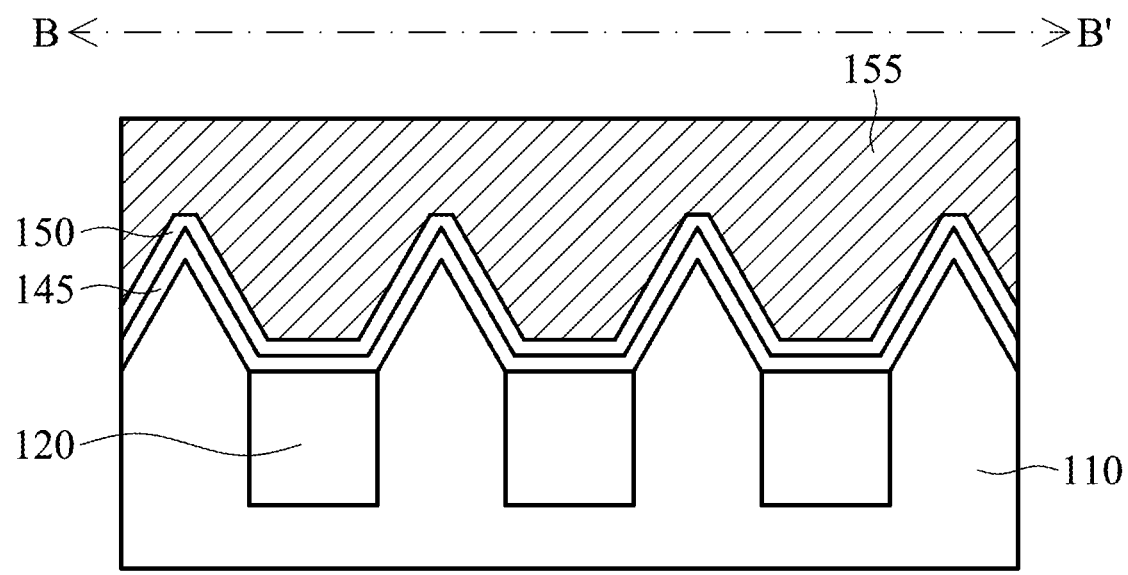

Next, referring to FIG. 3A and FIG. 3B, a lower gate dielectric layer 145 is formed on the substrate 110 and in the word line trenches 140 by a suitable deposition process. Specifically, the lower gate dielectric layer 145 is formed on the hard mask layer 135 and on the sidewalls and the bottom surfaces of the word line trenches 140. Next, a lower gate liner 150 and a lower gate electrode 155 are sequentially formed on the substrate 110 and in the word line trenches 140. Specifically, the lower gate liner 150 and the lower gate electrode 155 are sequentially formed on the hard mask layer 135 and on the sidewalls and the bottom surfaces of the word line trenches 140. In other words, the lower gate dielectric layer 145, the lower gate liner 150 and the lower gate electrode 155 are conformally deposited along the surface profile of FIG. 2A. The adhesion of the lower gate electrode 150 is increased by forming the lower gate liner 150 between the lower gate dielectric layer 145 and the lower gate electrode 155.

Examples of the material of which the lower gate dielectric layer 145 is made include silicon oxide, silicon nitride, silicon oxynitride, high dielectric constant material and the like. Examples of the material of which the lower gate liner 150 is made include WN, TiN, TaN, and the like, and combinations thereof. Examples of the material of which the lower gate electrode 155 is made include conductive materials such as amorphous silicon, polysilicon, metal, metal nitride, conductive metal oxide, and the like, and combinations thereof.

Figure 4A:
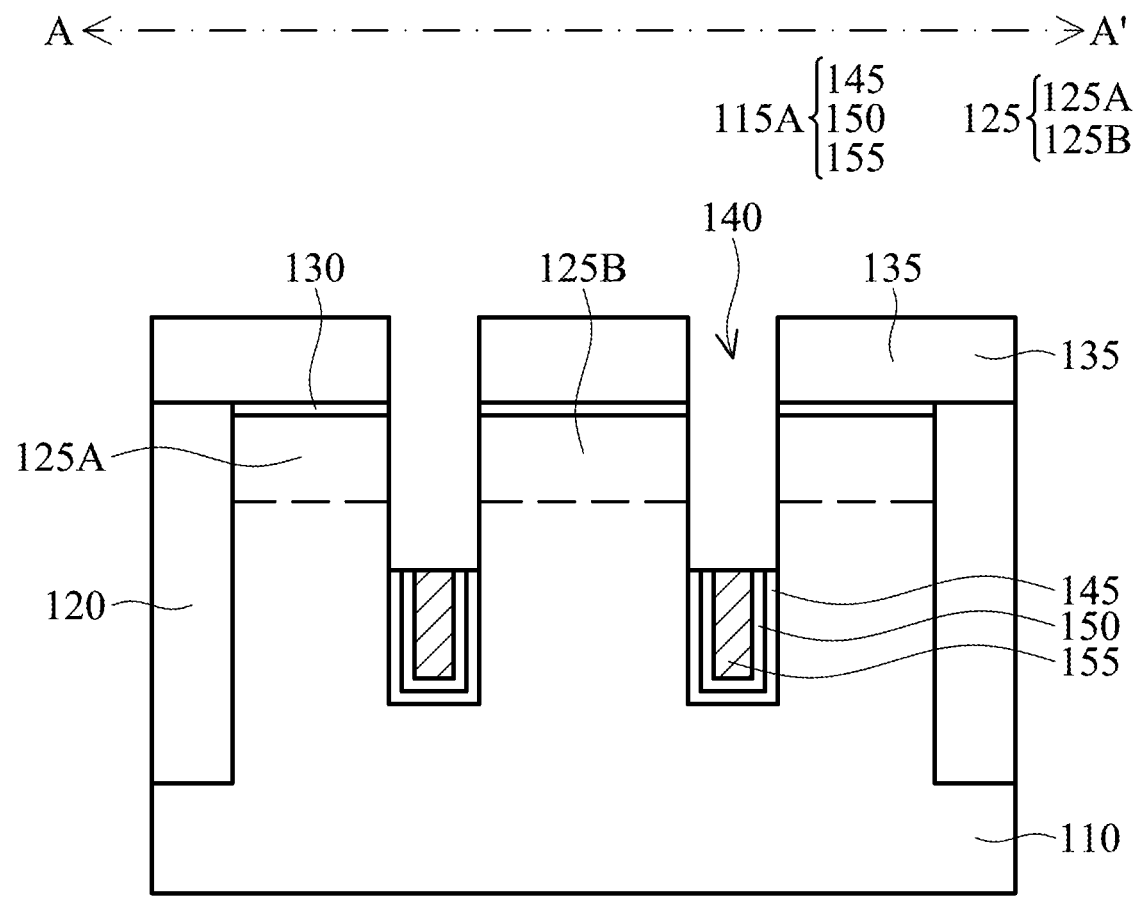
Figure 4B:
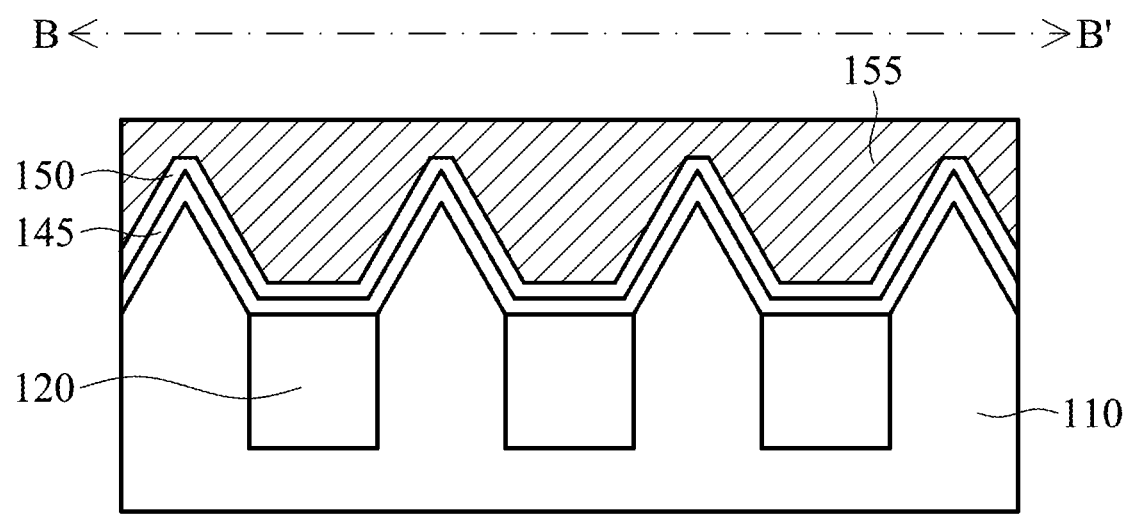

Next, referring to FIG. 4A and FIG. 4B, the lower gate liner 150 on the top surface of the substrate 110 and portions of the lower gate liner 150 and the lower gate electrode 155 on the sidewall of the word line trench 140 are first removed by a first etching process. Next, the lower gate dielectric layer 145 on the top surface of the substrate 110 and a portion of the lower gate dielectric layer 145 on the sidewalls of the trenches 140 are removed by a second etching process, such as wet etching using DHF, to form a lower gate 115A of the word line 115.

The lower gate 115A includes the lower gate dielectric layer 145 formed in the word line trench 140, the lower gate liner 150 formed on the lower gate dielectric layer 145 and the lower gate electrode 155 formed on the lower gate liner 150. Specifically, the lower gate liner 150 surrounds the lower gate electrode 155; and the lower gate dielectric layer 145 surrounds the lower gate liner 150 and the lower gate electrode 155. Specifically, the lower gate liner 150 surrounds three sidewalls of the lower gate electrode 155 in a U-shape; and the lower gate dielectric layer 145 also surrounds the lower gate liner 150 and the lower gate electrode 155 in a U-shape. The lower gate dielectric layer 145 surrounds the lower gate liner 150 and the lower gate electrode 155 to electrically isolate the lower gate liner 150 and the lower gate electrode 155 from the substrate 110. In some embodiments, the top surfaces of the lower gate dielectric layer 145, the lower gate liner 150 and the lower gate electrode 155 are coplanar. In other words, the top surface of the lower gate 115A is flat.

Figure 5A:
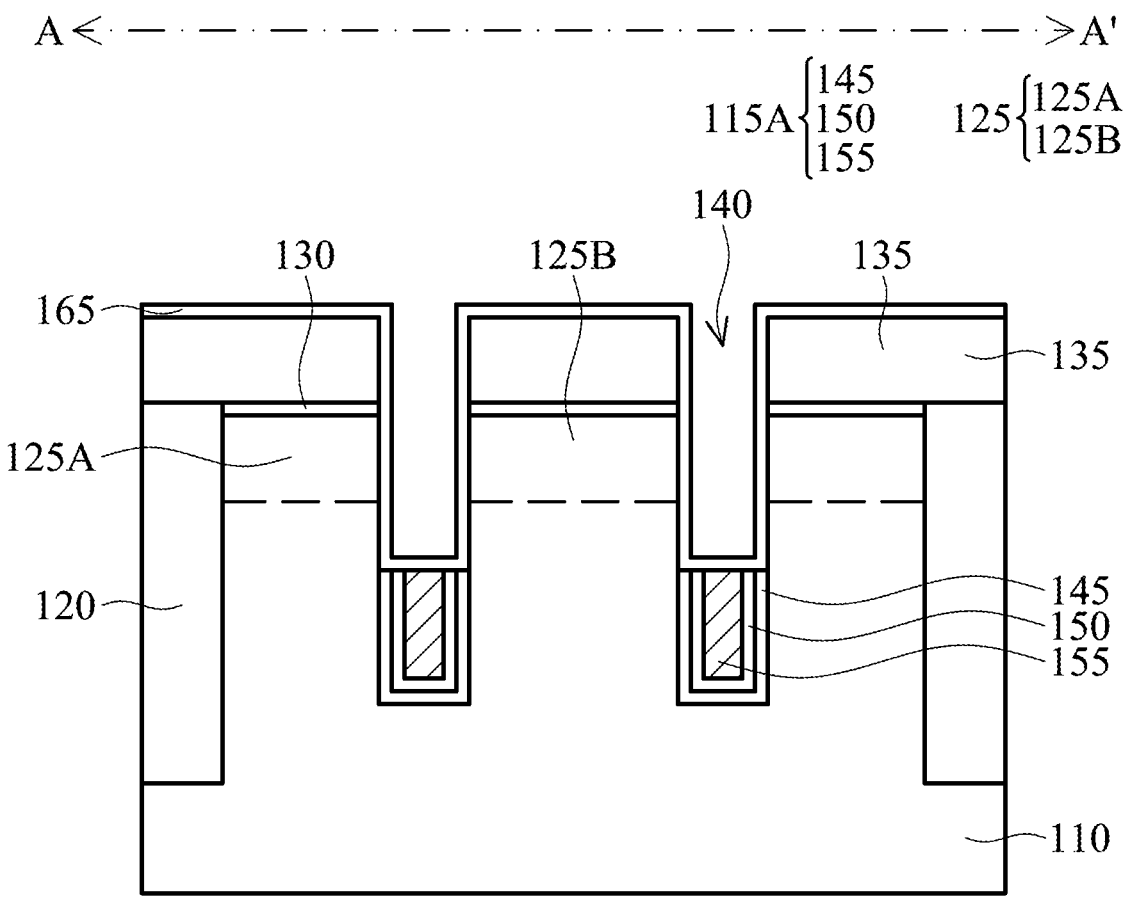
Figure 5B:
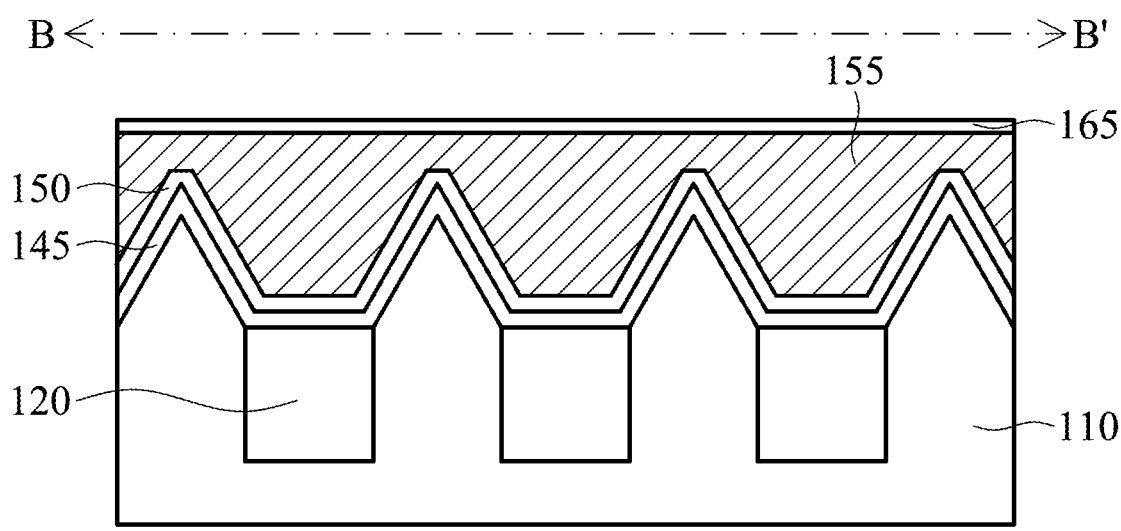

Next, referring to FIG. 5A and FIG. 5B, an upper gate dielectric layer 165 is formed on the substrate 110 and in the word line trench 140. Specifically, the upper gate dielectric layer 165 is formed on the top surface of the hard mask layer 135 and the sidewalls of the word line trench 140 and the top surface of the lower gate 115A.

Figure 6A:
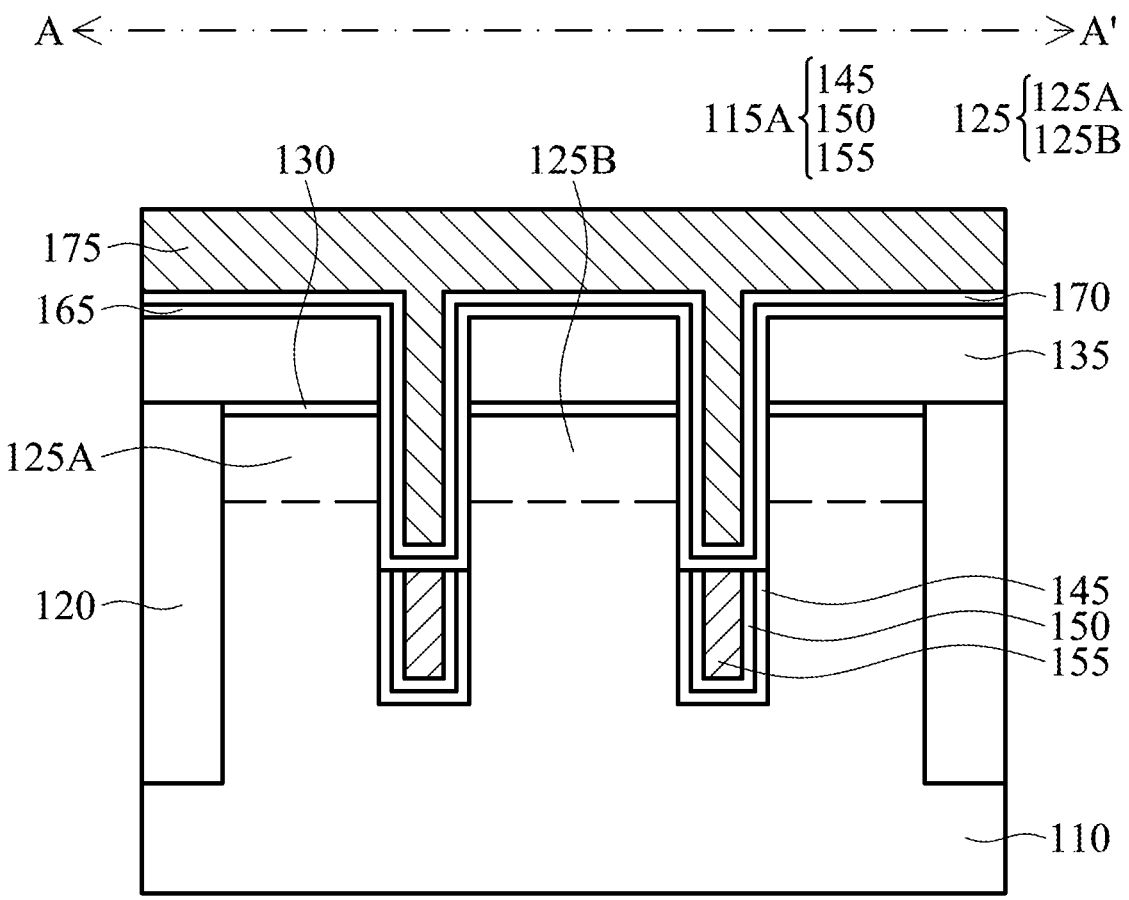
Figure 6B:
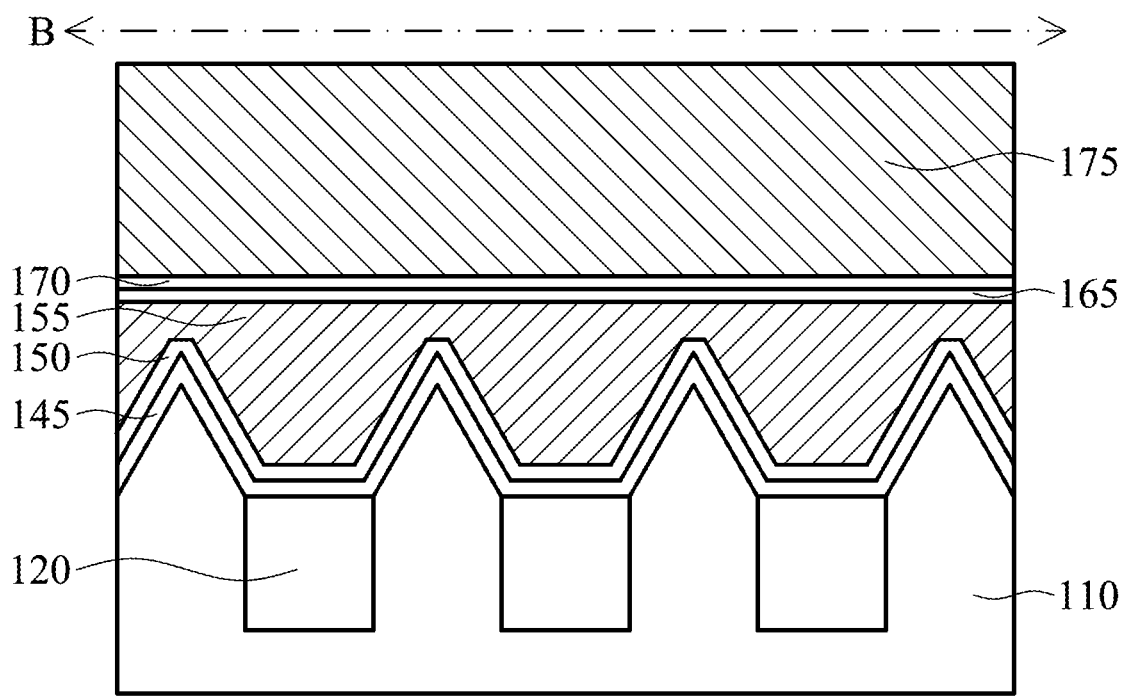

Next, referring to FIG. 6A and FIG. 6B, an upper gate liner 170 and an upper gate electrode 175 are sequentially aimed on the substrate 110 and in the word line trench 140. Specifically, the upper gate liner 170 and the upper gate electrode 175 are sequentially formed on the upper gate dielectric layer 165.

Figure 7A:
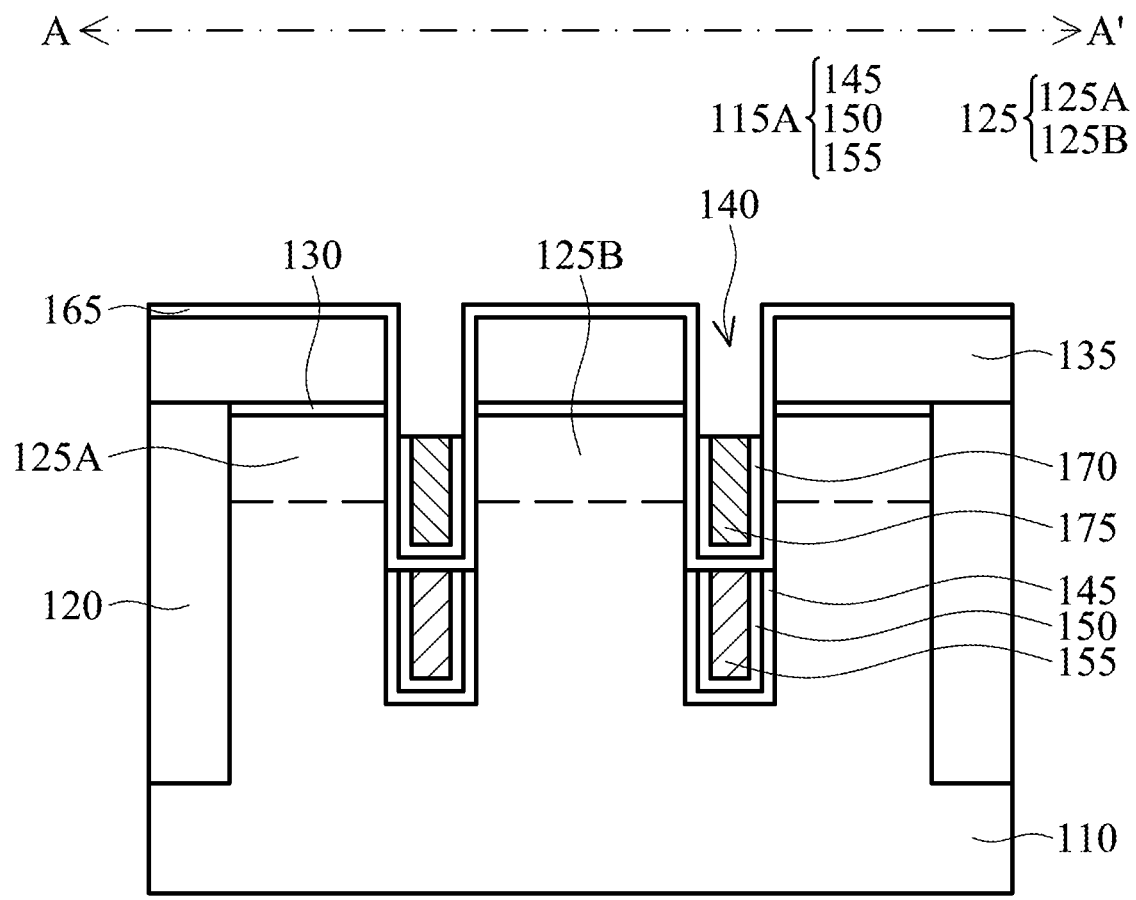
Figure 7B:
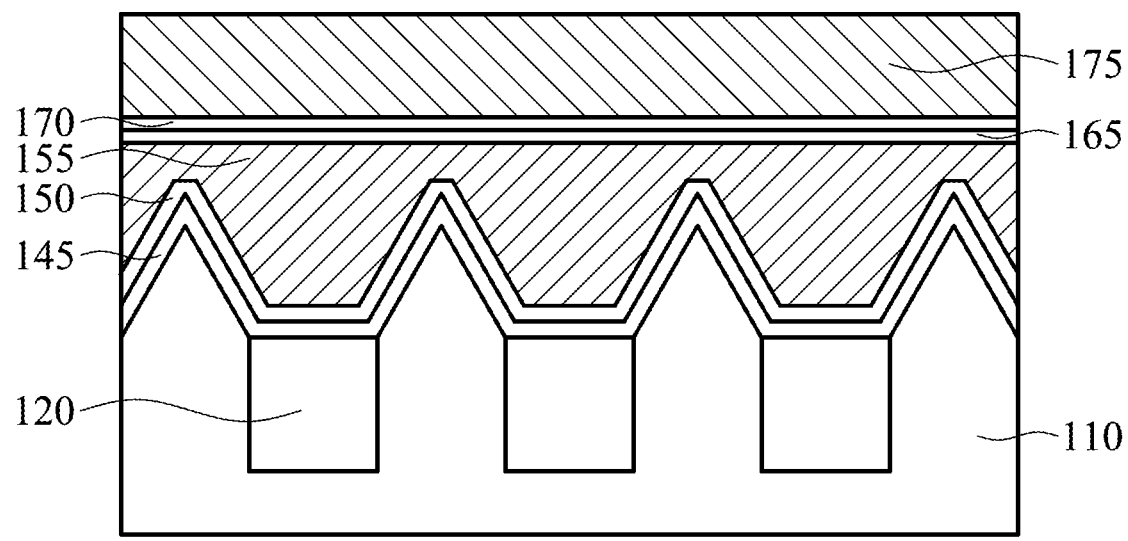

Referring to FIG. 7A and FIG. 7B, the upper gate liner 170 and the upper gate electrode 175 on the top surface of the substrate 110 and portions of the upper gate liner 170 and the upper gate electrode 175 on the sidewalls of the word line trenches 140 are first removed by a first etching process.

Figure 8A:
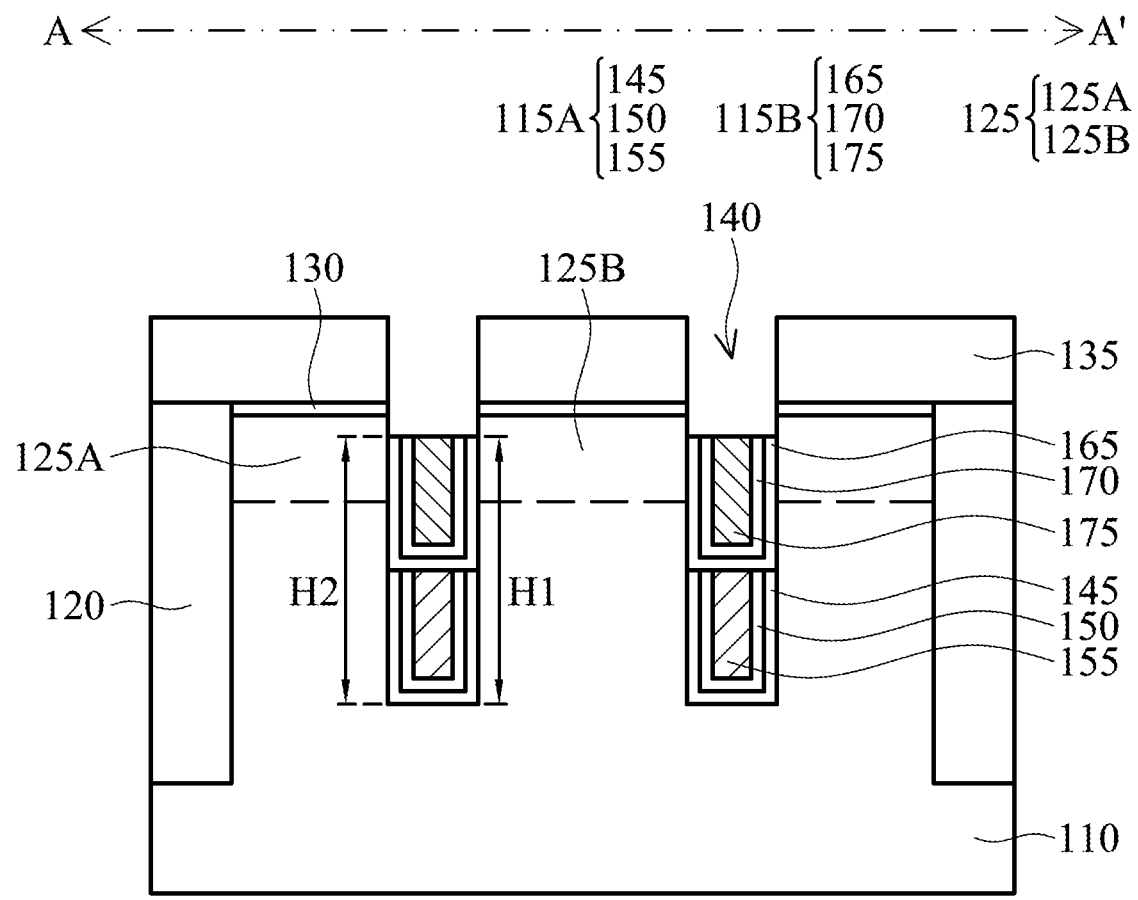
Figure 8B:
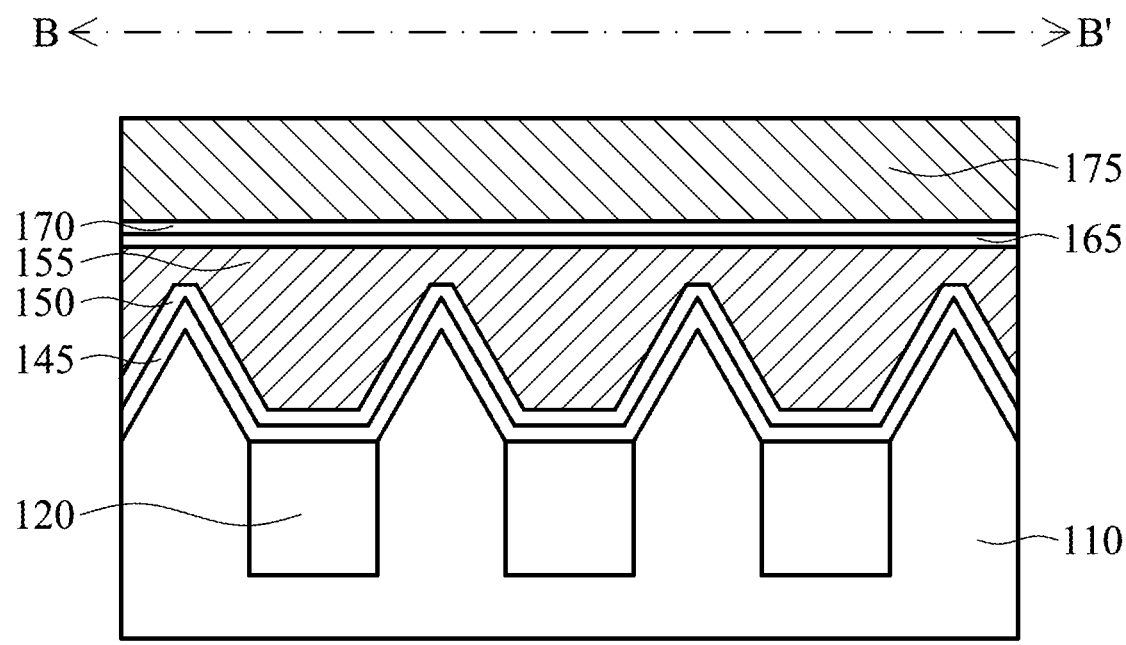

Referring to FIG. 8A and FIG. 8B, the upper gate dielectric layer 165 on the substrate 110 and a portion of the upper gate dielectric layer 165 on the sidewalls of the word line trench 140 are removed by a second etching process, such as wet etching using DHF, to form an upper gate 115B of the word line 115. The upper gate 115B includes the upper gate electrode 175, the upper gate liner 170 surrounding on the upper gate electrode 175, and the upper gate dielectric layer 165 surrounding the upper gate liner 170 and the upper gate electrode 175. The upper gate dielectric layer 165 surrounds the upper gate liner 170 and the upper gate electrode 175 to electrically isolate the upper gate liner 170 and the upper gate electrode 175 from the substrate 110. Specifically, the upper gate liner 170 surrounds three sidewalls of the upper gate electrode 175 in a U-shape; and the upper gate dielectric layer 165 also surrounds the upper gate liner 170 and upper gate electrode 175 in a U-shape.

The materials and forming methods of the upper gate dielectric layer 165, the upper gate liner 170 and the upper gate electrode 175 are similar to those of the lower gate dielectric layer 145, the lower gate liner 150 and the lower gate electrode 155, which will not be repeated herein.

In some embodiments, the top surface of the upper gate dielectric layer 165 is coplanar with the top surface of the upper gate electrode layer 175. In other words, there is a vertical distance H1 between the top surface of the upper gate dielectric layer 165 and the bottom surface of the word line trench 140, and there is a vertical distance H2 between the top surface of the upper gate electrode layer 175 and the bottom surface of the word line trench 140, wherein the vertical distance H1 is equal to the vertical distance H2.

In some embodiments, the thickness of the lower gate 115A is the same as that of the upper gate 115B. In other embodiments, the thickness of the lower gate 115A and the upper gate 115B are different. For example, the thickness of the lower gate 115A is greater than that of the upper gate 115B; or the thickness of the lower gate 115A is smaller than that of the upper gate 115B.

Since the upper gate 115B and the lower gate 115A are electrically isolated by the upper gate dielectric layer 165, it can make sure that the upper gate 115B and the lower gate 115A do not affect each other when the upper gate 115B and the lower gate 115A are separately supplied with voltage.

Figure 9B:
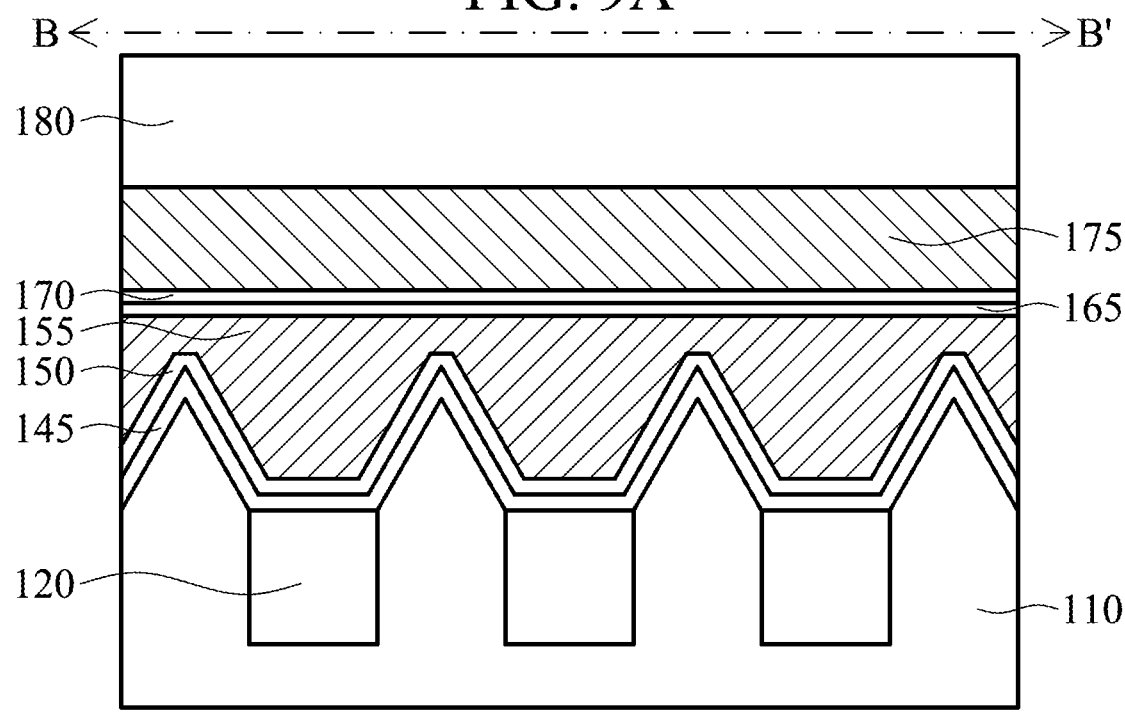

Next, referring to FIG. 9A and FIG. 9B, a protection layer 180 is formed on the substrate 110. Specifically, the protection layer 180 is formed on the top surface of the hard mask layer 135, on the sidewalls of the word line trench layer 140 and on the top surface of the upper gate 115B by a suitable deposition process. Examples of the material of which the protection layer 180 is made may include titanium nitride, silicon nitride, silicon oxynitride, silicon carbonitride, and the like, and combinations thereof.

Compared with the prior art, the memory structure provided by the embodiments of the present invention at least has the following advantages:

(1) Since the upper gate and the lower gate are formed in one word line, the gate voltage can be applied separately and independently to reduce the phenomena of gate induced drain leakage and sub-leakage, thereby improving the reliability of the memory device.

(2) Since the height of the upper gate electrode of the upper gate is the same as the height of the upper gate dielectric layer, the current path from the source to the drain is shorter, which can increase the operation speed of the memory.

(3) Since the upper gate and the lower gate are electrically isolated by the upper gate dielectric layer, this ensures that the upper gate and the lower gate do not affect each other when voltage is applied separately to the upper gate and the lower gate.

What is claimed is:

1. A memory structure, comprising:
    a substrate;
    an isolation structure disposed in the substrate;
    a word line trench disposed in the substrate and having a bottom surface; and
    a word line disposed in the word line trench, and the word line comprises an upper gate and a lower gate, wherein the upper gate comprises:
        an upper gate dielectric layer disposed in the word line trench and having a top surface;
        an upper gate liner disposed on the upper gate dielectric layer; and
        an upper gate electrode disposed on the upper gate liner and having a top surface, and the lower gate comprises:
        a lower gate dielectric layer disposed in the word line trench;
        a lower gate liner disposed on the lower gate dielectric layer; and
        a lower gate electrode disposed on the lower gate liner,
    wherein a vertical distance between the top surface of the upper gate dielectric layer and the bottom surface of the word line trench is not greater than a vertical distance between the top surface of the upper gate electrode and the bottom surface of the word line trench.

2. The memory structure as claimed in claim 1, wherein the upper gate and the lower gate are electrically isolated by the upper gate dielectric layer.

3. The memory structure as claimed in claim 1, further comprising:
    a hard mask layer and a protection layer disposed on the substrate.

4. The memory structure as claimed in claim 1, wherein the isolation structure is a shallow trench isolation structure.

5. The memory structure as claimed in claim 3, wherein the protection layer is further disposed in the word line trench.

6. The memory structure as claimed in claim 1, wherein a thickness of the upper gate is the same as a thickness of the lower gate.

7. The memory structure as claimed in claim 1, wherein the upper gate dielectric layer surrounds the upper gate liner in a U-shape.

8. The memory structure as claimed in claim 1, wherein the upper gate liner and the lower gate liner include WN, TiN, TaN or a combination thereof.

9. A method of manufacturing a memory structure, comprising:

providing a substrate;
forming an isolation structure in the substrate;
forming a word line trench in the substrate and the word line trench has a bottom surface; and
forming a word line in the word line trench and the word line comprises an upper gate and a lower gate, wherein the upper gate comprises:
    forming an upper gate dielectric layer in the word line trench and the upper gate dielectric layer has a top surface;
    forming an upper gate liner on the upper gate dielectric layer; and
    forming an upper gate electrode on the upper gate liner and the upper gate electrode has a top surface, and the lower gate comprises:
    forming a lower gate dielectric layer in the word line trench;
    forming a lower gate liner on the lower gate dielectric layer; and
    forming a lower gate electrode on the lower gate liner,
wherein a vertical distance between the top surface of the upper gate dielectric layer and the bottom surface of the word line trench is not greater than a vertical distance between the top surface of the upper gate electrode and the bottom surface of the word line trench.

10. The method of manufacturing a memory structure as claimed in claim 9, wherein the upper gate and the lower gate is electrically isolated by the upper gate dielectric layer.

11. The method of manufacturing a memory structure as claimed in claim 9, further comprising:
    forming a hard mask layer and a protection layer on the substrate.

12. The method of manufacturing a memory structure as claimed in claim 9, wherein the isolation structure is a shallow trench isolation structure.

13. The method of manufacturing a memory structure as claimed in claim 11, further comprising forming the protection layer in the word line trench.

14. The memory structure as claimed in claim 9, wherein a thickness of the upper gate is the same as a thickness of the lower gate.

15. The memory structure as claimed in claim 9, wherein the upper gate dielectric layer surrounds the upper gate liner in a U-shape.

16. The memory structure as claimed in claim 9, wherein the upper gate liner and the lower gate liner include WN, TiN, TaN or a combination thereof.

\* \* \* \* \*